(12) United States Patent
Li et al.

(10) Patent No.: US 12,100,759 B2
(45) Date of Patent: Sep. 24, 2024

(54) SEMICONDUCTOR DEVICE, MANUFACTURING METHOD AND ELECTRONIC EQUIPMENT

(71) Applicant: GUANGDONG ZHINENG TECHNOLOGY CO., LTD., Guan (CN)

(72) Inventors: Zilan Li, Guangzhou (CN); Shuxin Zhang, Guangzhou (CN); Weibin Chen, Guangzhou (CN)

(73) Assignee: GUANGDONG ZHINENG TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/436,009

(22) PCT Filed: Mar. 2, 2021

(86) PCT No.: PCT/CN2021/078575
§ 371 (c)(1),
(2) Date: Sep. 2, 2021

(87) PCT Pub. No.: WO2021/258765
PCT Pub. Date: Dec. 30, 2021

(65) Prior Publication Data
US 2023/0108909 A1 Apr. 6, 2023

(30) Foreign Application Priority Data

Jun. 24, 2020 (CN) .......................... 202010590696.3
Dec. 22, 2020 (CN) .......................... 202011527315.3

(51) Int. Cl.
*H01L 29/778* (2006.01)
*H01L 29/20* (2006.01)
*H01L 29/66* (2006.01)

(52) U.S. Cl.
CPC ...... *H01L 29/7787* (2013.01); *H01L 29/2003* (2013.01); *H01L 29/66462* (2013.01)

(58) Field of Classification Search
CPC ............. H01L 29/7787; H01L 29/2003; H01L 29/66462; H01L 29/0603; H01L 29/107;
(Continued)

(56) References Cited

U.S. PATENT DOCUMENTS

2013/0075750 A1* 3/2013 Minoura ............... H03F 1/3247
257/E21.09
2013/0256685 A1 10/2013 Ohki
(Continued)

FOREIGN PATENT DOCUMENTS

CN 103022119 A 4/2013
CN 105870013 A 8/2016
(Continued)

OTHER PUBLICATIONS

International Search Report and Written Opinion for PCT/CN2021/078575 issued Jun. 10, 2021, 11 total pages.
(Continued)

*Primary Examiner* — Yasser A Abdelaziz
(74) *Attorney, Agent, or Firm* — Casimir Jones SC; Tyler Sisk

(57) ABSTRACT

The present disclosure provides a semiconductor device, a manufacturing method, and electronic equipment. The semiconductor device including: a substrate; an interface, for generating two-dimensional charge carrier gas; a first electrode and a second electrode; and a first semiconductor layer of a first type doping formed on the substrate, wherein first regions and a second region are formed in the first semiconductor layer, wherein in the first regions, the dopant atoms of the first type do not have electrical activity, and in the second region, the dopant atoms of the first type have
(Continued)

electrical activity; and the second region includes a portion coplanar with the first regions.

18 Claims, 8 Drawing Sheets

(58) Field of Classification Search
CPC ............. H01L 29/1075; H01L 29/1083; H01L 29/205; H01L 29/32; H01L 29/66212; H01L 29/802; H01L 29/872; H01L 29/7786
See application file for complete search history.

(56) References Cited

U.S. PATENT DOCUMENTS

| | | | |
|---|---|---|---|
| 2014/0242761 A1 | 8/2014 | Wong et al. | |
| 2015/0087118 A1* | 3/2015 | Chiang | ............. H01L 29/66462 438/172 |
| 2016/0064502 A1* | 3/2016 | Oka | ....................... H01L 29/513 257/411 |
| 2017/0373176 A1 | 12/2017 | Sriram | |

FOREIGN PATENT DOCUMENTS

| | | | | |
|---|---|---|---|---|
| CN | 212062440 U | 12/2020 | | |
| WO | WO-2020055984 A1 * | 3/2020 | ....... | H01L 21/26553 |

OTHER PUBLICATIONS

European Patent Office, Supplemental European Search Report for EP Application No. 21761955 dated May 31, 2022.
European Patent Office, Communication Pursuant to Article 94(3) EPC for EP Application No. 21761955 dated Jun. 13, 2022.

* cited by examiner

SEMICONDUCTOR DEVICE, MANUFACTURING METHOD AND ELECTRONIC EQUIPMENT

CROSS REFERENCE TO RELATED APPLICATION

This application is a 35 U.S.C § 371 national stage patent application of International Patent Application No. PCT/CN2021/078575 filed on Mar. 2, 2021 and entitled "SEMICONDUCTOR DEVICE, MANUFACTURING METHOD AND ELECTRONIC EQUIPMENT," which application claims the benefit of priority to Chinese Patent Application No. 202010590696.3 filed Jun. 24, 2020, and Chinese Patent Application No. 202011527315.3 filed Dec. 22, 2020, the disclosures and contents of all of which are hereby incorporated by reference in their entireties.

TECHNICAL FIELD

The present disclosure relates to the field of semiconductor technology, and in particular, to a semiconductor device, a manufacturing method, and electronic equipment.

BACKGROUND ART

Group III nitride semiconductor is an important new semiconductor material, which mainly comprises AlN, GaN, InN and compounds of these materials, such as AlGaN, InGaN, AlInGaN. The Group III nitride semiconductor has the advantages of direct band gap, wide forbidden band, high breakdown electric field strength, and the like. Through optimized design of the device structure and process, Group III nitride semiconductors have great prospects in the field of power semiconductors.

Taking the above-mentioned advantages of the Group III nitride semiconductors, it is desirable to use the optimized design of the device structure and process to develop high-performance semiconductor devices with high power, low on-resistance and the like.

In the existing Group III nitride semiconductor devices, mostly the semiconductor layers near the gate electrode or the anode are processed by means of the selective area growth, so as to realize the desired device. However, the above process method involves the larger morphology caused by the selective area growth. Therefore, the control on the process is relatively complicated.

SUMMARY

In order to solve the technical problems known and existing in the art, the present disclosure aims to provide a semiconductor device, a manufacturing method, and an electronic equipment, which can, for example, avoid damage to the crystal structure, and can be easily realized in the process, and can maintain the better transport properties of the two-dimensional charge carrier gas, beneficial to the improvement of device performance.

A brief summary of the present disclosure will be given as follows, in order to provide a basic understanding of certain aspects of the present disclosure. It should be understood that this brief summary is not an exhaustive explanation of the present disclosure. It is not intended to determine the key or important part of the present disclosure, nor is it intended to limit the scope of the present disclosure. Its purpose is merely to provide some concepts in a simplified form, serving as a prelude to the more detailed description that will be discussed later.

According to content of the present disclosure, a semiconductor device is provided, comprising: a substrate; an interface, for generating two-dimensional charge carrier gas; a first electrode and a second electrode; and a first semiconductor layer, containing dopant atoms of a first type, formed on the substrate, wherein first regions and a second region are formed in the first semiconductor layer, wherein in the first regions, the dopant atoms of the first type do not have electrical activity, and in the second region, the dopant atoms of the first type have electrical activity; and the second region comprises a portion coplanar with the first regions.

Optionally, in the above, the first regions are a region co-doped with dopant atoms of the first type and dopant atoms of the second type, and the second region is a region doped with dopant atoms of the first type, wherein in the first regions, two-dimensional charge carrier gas at an interface corresponding to the first regions is not depleted, and in a sub-region of the second region, two-dimensional charge carrier gas at an interface corresponding to the sub-region is substantially depleted.

Optionally, when the semiconductor device is a HEMT or a diode, the first regions as a whole are of N-type, weak P-type, high-resistance type, or insulating type; and when the semiconductor device is an HHMT, the first regions as a whole are of P-type, weak N-type, high-resistance type, or insulating type.

Optionally, in the above, thickness of the first region is less than or equal to that of the second region.

Optionally, in the above, the first region at least corresponds to a region between the first electrode and the second electrode.

Optionally, in the above, when the semiconductor device is a HEMT/HHMT, a projection range of a sub-region in the second region relative to the substrate is less than or equal to the a projection range of the second electrode relative to the substrate; and when the semiconductor device is a diode, a projection range of a sub-region in the second region relative to the substrate is larger than a projection range of the second electrode relative to the substrate.

Optionally, in the above, the dopant atoms of the second type are atoms of an N-type or being capable of generating a deep level effect, and the dopant atoms of the first type is P-type atoms, alternatively, the dopant atoms of the second type are atoms of P-type or being capable of generating a deep level effect, and dopant atoms of the first type are of N-type.

Optionally, in the above, doping concentration of the dopant atoms of the second type is greater than 10% of doping concentration of the doping atoms of the first type.

Optionally, in the above, the doping concentration of the dopant atoms of the second type is uniformly distributed or gradually decreases along a direction of the first electrode, perpendicular to the substrate.

Optionally, in the above, the N-type dopant atoms are silicon or germanium, and the P-type dopant atoms are magnesium.

Optionally, in the above, the atom capable of generating a deep level effect is nitrogen, carbon, iron or argon, and the P-type dopant atoms are magnesium.

Optionally, in the above, the first regions are continuous or discrete; or each section of the first region is in regular or irregular shape.

Optionally, in the above, when the first regions are discrete, thicknesses of the first regions are equal or unequal to each other.

Optionally, in the above, it further comprises a second semiconductor layer formed on the first semiconductor layer, wherein the two-dimensional charge carrier gas is formed at an interface between the first semiconductor layer and the second semiconductor layer.

Optionally, in the above, it further comprises a third semiconductor layer formed on the first semiconductor layer, wherein the two-dimensional charge carrier gas is formed at an interface between the third semiconductor layer and the second semiconductor layer.

Optionally, in the above, the doping concentration of the dopant atoms of the first type in the first semiconductor layer is set as being uniformly distributed, gradually increasing in the direction of the electrode perpendicular to the substrate, or being high at both end and low in the middle in the direction of the electrode perpendicular to the substrate.

Optionally, in the above, the second semiconductor layer is further provided with a passivation layer.

Optionally, in the above, the substrate is further provided with a nucleation layer, a buffer layer or an insertion layer.

Optionally, in the above, the first electrode is a cathode and the second electrode is an anode.

Optionally, in the above, the first electrode is a source electrode or a drain electrode, and the second electrode is a gate electrode.

Optionally, in the above, it further comprises a body electrode, wherein the body electrode is electrically connected to or disconnected from the first electrode.

Optionally, in the above, it further comprises a body electrode, wherein the body electrode is in an Ohmic contact with the first semiconductor layer.

According to content of the present disclosure, a manufacturing method of a semiconductor device is provided, comprising: providing a substrate; forming an interface that generates two-dimensional charge carrier gas; and forming at least a first electrode and a second electrode; forming, on the substrate, a first semiconductor layer containing dopant atoms of a first type, wherein dopant atoms of the second type are doped at the first region in the first semiconductor layer so that the dopant atoms of the first type in the first region do not have electrical activity, and the second region in the first semiconductor layer, which is not doped with the dopant atoms of the second type, has the dopant atoms of the first type having electrical activity.

Optionally, in the above, dopant atoms of the second type are atoms of N-type or being capable of generating deep-level effect, and dopant atoms of the first type are P-type atoms; and alternatively, dopant atoms of the second type are atoms of P-type or being capable of generating a deep level effect, and dopant atoms of the first type are of N-type.

Optionally, in the above, doping concentration of the dopant atoms of the second type is greater than 10% of doping concentration of the doping atoms of the first type.

Optionally, in the above, the doping concentration of the dopant atoms of the second type is uniformly distributed or gradually decreases along a direction of the first electrode perpendicular to the substrate.

Optionally, in the above, the N-type dopant atoms are silicon or germanium, and the P-type dopant atoms are magnesium; and the atoms capable of generating a deep level effect are carbon, argon, iron, or nitrogen.

Optionally, in the above, in the first regions, two-dimensional charge carrier gas at an interface corresponding to the first regions is not depleted, and in a sub-region of the second region, two-dimensional charge carrier gas at an interface corresponding to the sub-region is substantially depleted.

Optionally, in the above, the first region is formed in the first semiconductor layer, at least corresponding to the region between the first electrode and the second electrode.

Optionally, in the above, the method for forming the first region is to: form a mask layer on the first semiconductor layer; form a pattern having openings by lithographically etching the mask layer; and then ion-implant the dopant atoms of the second type.

Optionally, in the above, selectively the opening is to:

shield the upper surface of the first semiconductor layer corresponding to the second electrode, and the upper surface of the first semiconductor layer near the first electrode in the direction away from the second electrode; or shield the upper surface of the first semiconductor layer corresponding to the second electrode.

Optionally, in the above, selectively, the forming method of the first region is as follows:

method 1: a second-type dopant atom material layer is formed on the first semiconductor layer, and the material layer is lithographically etched to form a pattern having an opening, and then the second-type dopant atoms diffuse into the first semiconductor layer from the material layer by heat processing; or method 2: a mask layer having an opening is formed on the first semiconductor layer, and then a second-type dopant atom material layer is formed on the mask layer, the second-type dopant atom material layer only at the opening remains by striping the mask layer, then the second type dopant atoms diffuse from the material layer into the first semiconductor layer by heat processing.

Optionally, in the above, selectively, the opening in method 1 is to:

expose the upper surface of the first semiconductor layer corresponding to the second electrode and the upper surface of the first semiconductor layer near the first electrode in a direction away from the second electrode; or expose the upper surface of the first semiconductor layer corresponding to the second electrode.

In the above, the opening in the method 2 and the opening in the method 1 are of a complementary pattern.

Optionally, in the above, the opening is provided, so that the first region is formed to include continuous or discrete, regular or irregular sub-regions, or a combination of the foregoing.

Optionally, the depth of ion implantation or ion diffusion in each sub-region is less than or equal to the thickness of the first semiconductor layer, and individual sub-regions have the same or different implantation dose or diffusion time, and the combination of the above methods is feasible.

Optionally, it further comprises selectively forming a third semiconductor layer on the first semiconductor layer.

Optionally, it further comprises forming a second semiconductor layer on the first semiconductor layer or the third semiconductor layer, so that the two-dimensional charge carrier gas is formed at the interface between the first and second semiconductor layers or between the third and second semiconductor layers.

Optionally, in the above, it further comprises forming a first electrode, a second electrode, and a third electrode, wherein the first electrode and the third electrode are in Ohmic contact with the two-dimensional charge carrier gas, and the second electrode is in Schottky contact with the second semiconductor layer or the first semiconductor layer.

Optionally, in the above, it further comprises forming an insulating layer between the second electrode and the second semiconductor layer.

Optionally, in the above, it further comprises forming a passivation layer on the second semiconductor layer; or a nucleation layer, an insertion layer and/or a buffer layer are formed on the substrate.

Optionally, in the above, it further comprises forming a fourth electrode, wherein the fourth electrode is in Ohmic contact with the first semiconductor layer.

Optionally, in the above, the fourth electrode is electrically connected or not connected to the first electrode.

According to content of the present disclosure, electronic equipment is provided, including any of the above-mentioned semiconductor devices.

The technical solutions of the present disclosure can at least help to achieve one of the following effects: avoiding damage to the crystal structure, and being easy to be achieved in the process, being able to maintain better transport properties of two-dimensional charge carrier gas as well, and achieving better stability of threshold voltage, contributing to the electric field distribution of the devices, and achieving higher capability of withstanding voltage.

BRIEF DESCRIPTION OF DRAWINGS

The specific content of the present disclosure will be described below with reference to the accompanying drawings, which will help to more easily understand the above and other purposes, features and advantages of the present disclosure. The drawings are only to illustrate the principles of the present disclosure. In the drawings, it is not necessary to draw the size and relative positions of the units according to scale. In the drawings.

DETAILED DESCRIPTION OF EMBODIMENTS

Figure 1:
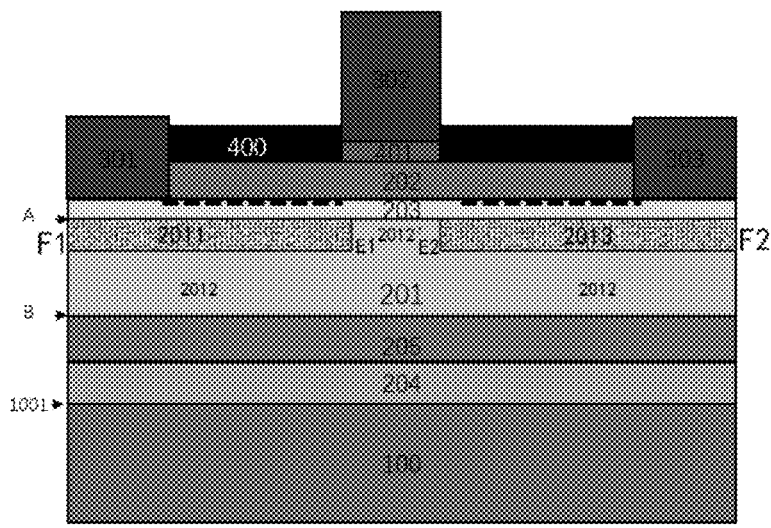
FIGS. 1-2 show schematic sectional views according to embodiments of the present disclosure.

Hereinafter, an exemplary disclosure content of the present disclosure will be described with reference to the accompanying drawings. For the sake of clarity and conciseness, not all the features that realize the present disclosure are described in the specification. However, it should be understood that in the process of developing any implementation of the present disclosure, many decisions specific to the present disclosure may be made in order to achieve the specific objectives of the developer, and these decisions may vary depending on the present disclosure.

Here, it should also be noted that, in order to avoid obscuring content of the present disclosure due to unnecessary details, only the device structures closely related to the technical solution according to the present disclosure are shown in the drawings, and other details that are not very relevant to the content of the present disclosure are omitted.

It should be understood that the present disclosure is not limited to the described implementation form due to the following description with reference to the accompanying drawings. In the present disclosure, when feasible, features can be substituted or borrowed between different embodiments, and one or more features can be omitted from one embodiment.

The drawings may be referred to in the following specific embodiments, with the drawing constituting a part of the present disclosure and illustrating exemplary embodiments. In addition, it should be understood that other embodiments may be utilized and structural and/or logical changes may be made without departing from the scope of the claimed subject matter. It should also be pointed out that the directions and references (for example, up, down, top, bottom, etc.) are only used to help the description of the features in the drawings, and should not be understood in a restrictive sense, as only using the following specific implementations.

As used in the specification and appended claims of the present disclosure, unless clearly dictated otherwise in the context, the singular forms "a", "an" and "the" also include plural forms. It will also be understood that the term "and/or" as used herein refers to and comprises any and all possible combinations of one or more of the associated listed items.

Specifically, the semiconductor device of the present disclosure may be a compound semiconductor device containing a nitride semiconductor material, also referred to as a nitride semiconductor device, wherein the nitride semiconductor device may be a Group III nitride semiconductor device. Optionally, the Group III nitride semiconductor device may include a transistor using a wurtzite Group III nitride semiconductor material and a GaN diode containing a GaN semiconductor material. Alternatively, the transistor may be a GaN transistor containing a GaN semiconductor material. In particular, the GaN transistor may be a normally off transistor GaN-HEMT and/or GaN-HHMT.

At present, the process of fabricating a Group III nitride semiconductor normally closed device is generally achieved by fabricating a P-type nitride semiconductor gate electrode on the barrier layer. Due to the poor insulation performance of the barrier layer, it is easy to cause the occurrence of a large gate current. At the same time, the distance between the gate electrode and the channel is relatively large due to the spacing of the barrier layer, which is not beneficial to obtaining a higher threshold voltage.

In view of this, the present disclosure provides a Group III nitride semiconductor normally closed device. By designing a new process method, the existing defects are overcome and the beneficial technical effects as described above are achieved.

Figure 2:
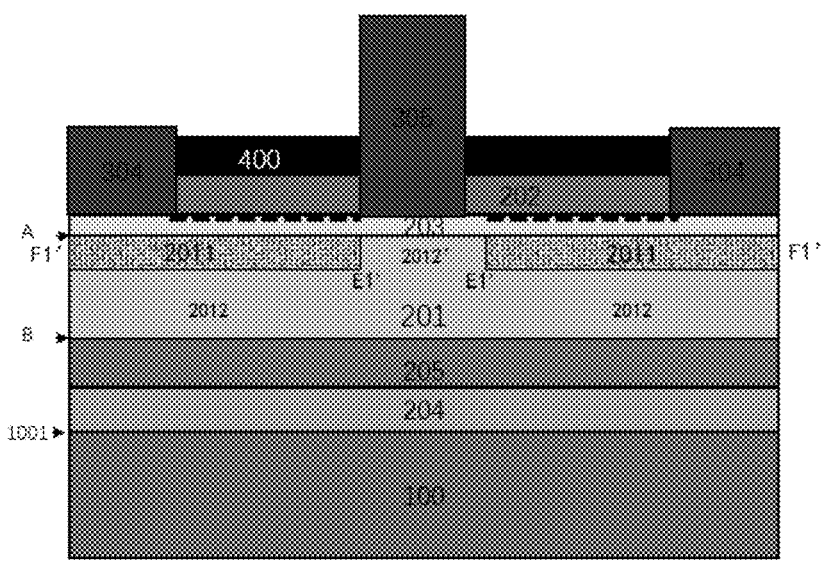
Figure 3:
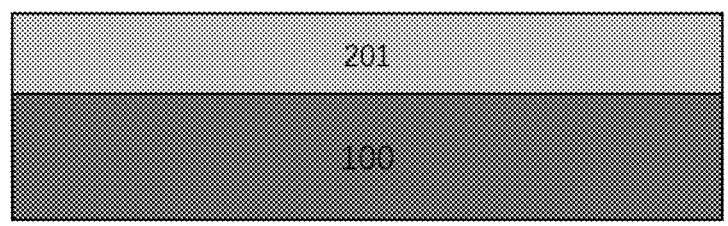
FIGS. 3-11 show schematic sectional views according to embodiments of the present disclosure.
Figure 4:
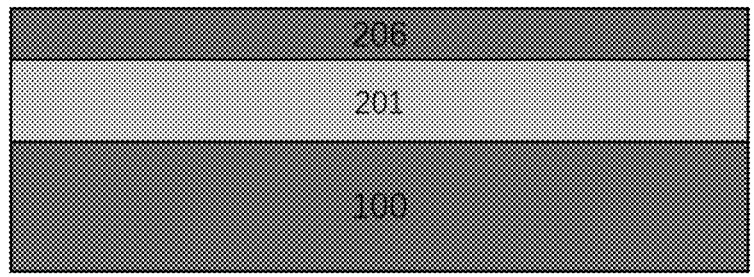
Figure 5:
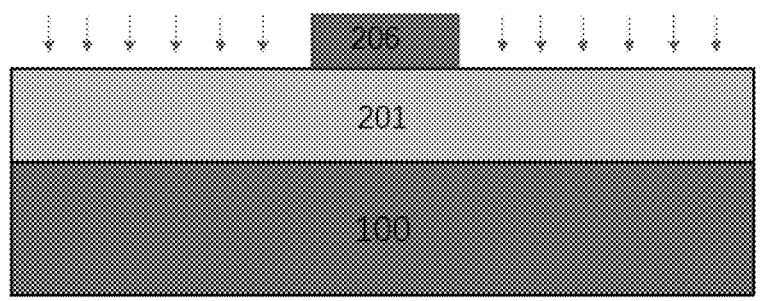
Figure 6:
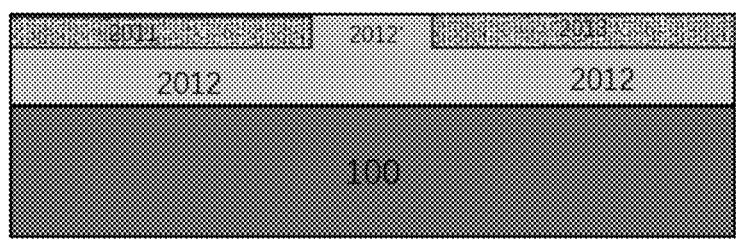
Figure 7:
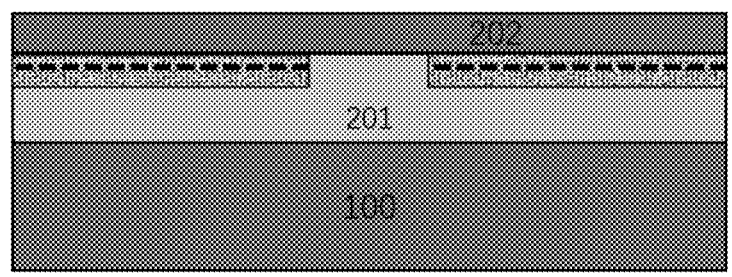
Figure 8:
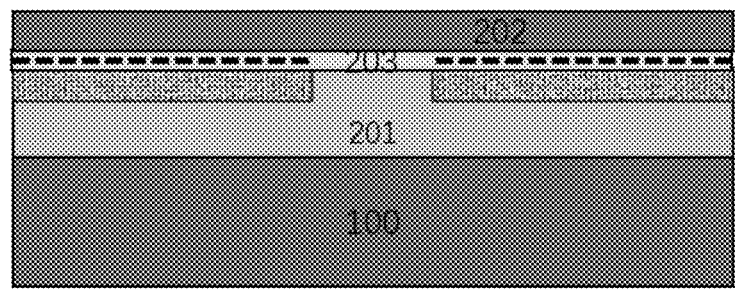
Figure 9:
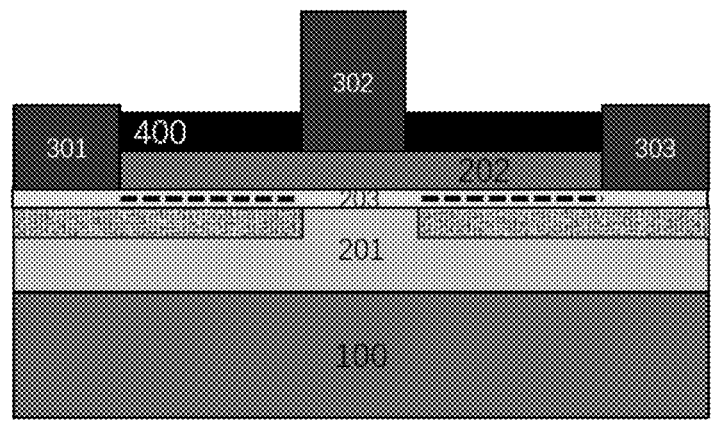
Figure 10:
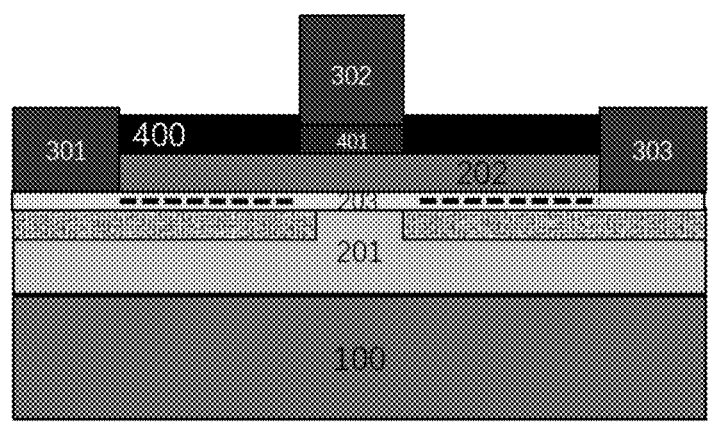
Figure 11:
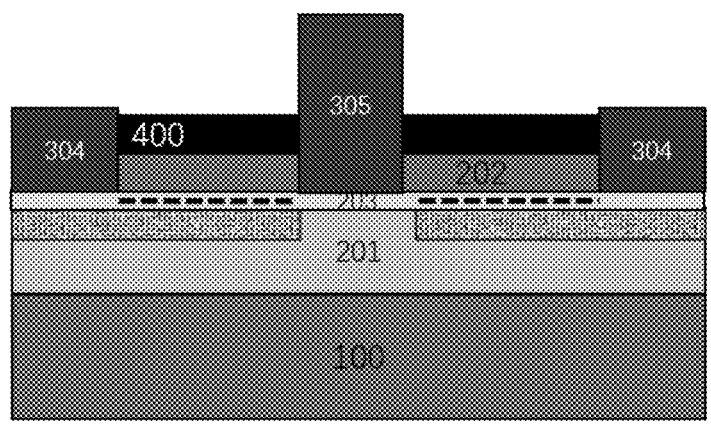
Figure 12:
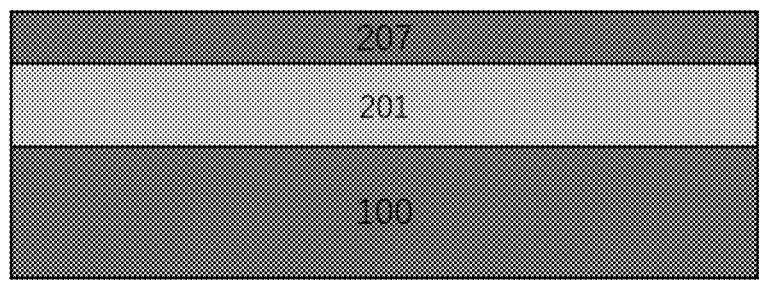
FIGS. 12-15 show schematic sectional views according to embodiments of the present disclosure.
Figure 13:
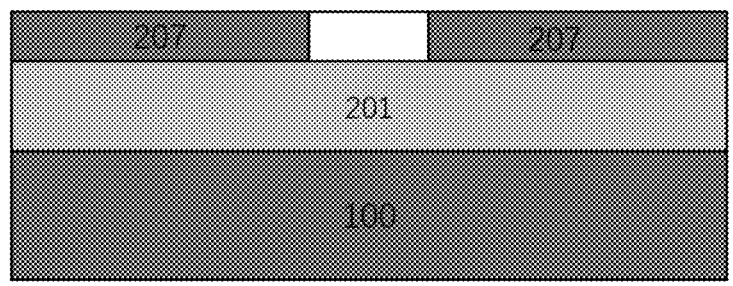
Figure 14:
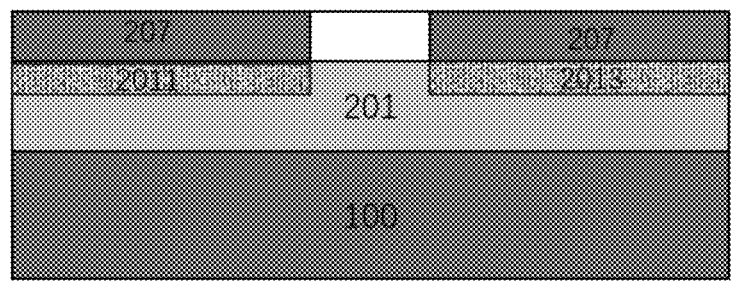
Figure 15:
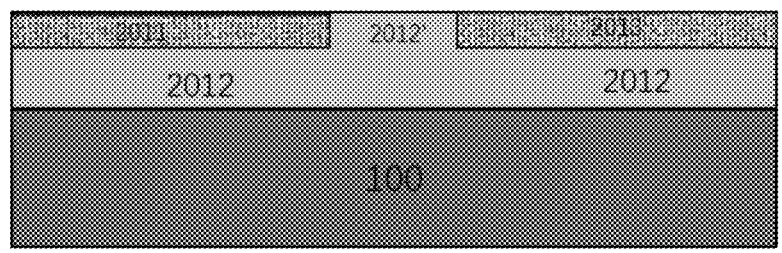

A semiconductor device according to an embodiment of the present disclosure is described with reference to FIGS. 1-2, wherein FIG. 1 shows the structure of the HEMT, and FIG. 2 shows the structure of the diode.

As shown in FIGS. 1-2, in the embodiments of the present disclosure, the semiconductor device may include a substrate 100, and the material of the substrate 100 may be selected according to actual needs. The specific form of the substrate 100 is not limited in this embodiment. Optionally, the substrate 100 may be ZnO, SiC, AN, GaAs, LiAlO, GaAlLiO, GaN, $Al_2O_3$ or monocrystalline silicon, etc.; and preferably, the substrate 100 may be $Al_2O_3$ of (0001) face; and more preferably, the substrate 100 may be a silicon substrate 100 of (111) face.

The first semiconductor layer 201 is formed on the first surface 1001 of the substrate 100. The first semiconductor layer 201 may have a first surface A and a second surface B. The first semiconductor layer 201, for example, may be P-GaN. Optionally, the concentration of P-doping in the first semiconductor layer 201 may be uniform; or the doping concentration of the first semiconductor layer 201 along the direction from the first surface A to the second surface B may be variable. For example, it may be gradually increasing from the first surface A to the second surface B, or it is set in such a way that the doping concentrations of the first surface A and the second surface B are higher and the concentration in the middle is lower. The doping concentration of the P-type impurity may be set in the range of $1E+17/cm^3$-$1E+20/cm^3$.

The second semiconductor layer 202 is formed on the first semiconductor layer 201. The first semiconductor layer 201 may have a forbidden bandwidth smaller than that of the second semiconductor layer 202. Two-dimensional charge carrier gas, such as 2DEG, is formed between the first semiconductor layer 201 and the second semiconductor layer 202. Optionally, the second semiconductor layer 202 may be an AlN, AlGaN, InAlGaN, InAlN layer, or the like.

It is understandable that a third semiconductor layer 203 can also be formed on the first semiconductor layer 201. The third semiconductor layer 203 can be used as a channel layer to reduce the scattering effect caused by P-GaN or impurities, so as to improve the electron mobility of the channel. Two-dimensional charge carrier gas, such as 2DEG, may be formed between the third semiconductor layer 203 and the second semiconductor layer 202, and the third semiconductor layer 203 may be an intrinsic or unintentionally doped GaN layer.

Next, as shown in FIG. 1, a source electrode 301, a gate electrode 302, and a drain electrode 303 may be formed on the second semiconductor layer 202. The drain electrode and the source electrode may be in Ohmic contact with the two-dimensional charge carrier gas. The gate electrode is in Schottky contact with the second semiconductor layer, or the gate electrode together with the second insulating layer and the second semiconductor layer may form a MIS gate, or as shown in FIG. 2, a cathode 304 and an anode 305 may be formed on the second semiconductor layer 202. The cathode may be in an Ohmic contact with the two-dimensional charge carrier gas, and the anode may be in an Schottky contact with the first semiconductor layer or the second semiconductor layer.

It is understandable that a nucleation layer 204 and/or a buffer layer 205 may also be formed between the substrate 100 and the first semiconductor layer 201, wherein when both the nucleation layer and the buffer layer are provided at the same time, the buffer layer may be formed on the nucleation layer. The buffer layer can reduce the strain of the first or third semiconductor layer, which would be subsequently formed above the buffer layer, so as to prevent defects from being formed in the above first or third semiconductor layer, and reduce the difference in lattice constant and thermal expansion coefficient and the like, and reduce the leakage current between the anode and the substrate. The material of the buffer layer, for example, may be one or more of semi-insulating GaN, AlN, AlGaN, InGaN, AlInN, and AlGaInN.

It is understandable that a first insulating layer 400 can also be formed on the second semiconductor layer 202. The insulating layer 400 may be a passivation layer, which can make the device more stable. Optionally, the material of the passivation layer is $SiO_2$, SiN, $Al_2O_3$, and the like. As shown in FIG. 1, a second insulating layer 401 can be formed between the gate electrode and the second semiconductor layer, with the material of $SiO_2$, SiN, $Al_2O_3$, and the like, to reduce gate leakage current.

The first semiconductor layer 201 can have the sub-region 2012', such that the interface formed by the second semiconductor layer and the first or third semiconductor layer, due to the depletion of the first semiconductor layer, when no bias is applied, has no 2DEG present at the interface, but 2DEG is present at the interface in the case of the positive bias. Exemplarily, the doping concentration of the P-type impurity may be $1E+17/cm^3$-$1E+20/cm^3$, and the impurity may be magnesium atoms. Here, the upper and lower surfaces of the sub-region 2012' and the upper and lower surfaces of the sub-region 2011/2013 in the first semiconductor layer 201 may be coplanar or not. Preferably, the thickness of the sub-region 2012' may be 10 to 100 nm, which can better improve the performance parameters of the device.

As shown in FIG. 1, at the sub-region 2011 in the first semiconductor layer 201 corresponding to between the source electrode and the gate electrode, at the sub-region 2013 in the first semiconductor layer 201 corresponding to between the drain electrode and the gate electrode, or at the sub-region 2011 in the first semiconductor layer 201 corresponding to between the cathode and the anode as shown in FIG. 2, it may also be doped with impurity atoms of different types from the P-type. The doped impurity atoms may be N-type atoms such as silicon or germanium, wherein due to the doping concentration of the N-type atoms such as silicon or germanium, the first semiconductor layer 201 has the region 2011/2013 where the N-doped atoms and the P-type atoms co-exist, with the region 2011/2013 being in the form of N-type or weak P-type as a whole. Exemplarily, the doping concentration of N-type atoms such as silicon or germanium can be made larger than or equal to 10% of the doping concentration of the P-type atoms. Exemplarily, the doping depth may be between 1 nanometer and 50 nanometers.

Alternatively, the doped impurities may be carbon, nitrogen, iron or argon atoms, with the doping concentration capable of being selected such that the region 2011/2013 of the first semiconductor layer 201 where the doped atoms and the P-type atoms co-exist, as a whole, is in a form that the impedance is more than ten times higher than the impedance of the region 2012 in the first semiconductor layer 201 where no two different atoms co-exist. Exemplarily, the doping concentration may be between 1 nanometer and 50 nanometers.

The region 2011 in the first semiconductor layer 201 in FIG. 1 corresponding to between the source electrode and the gate electrode may include a region range, starting from the edge E1 close to the source electrode 301 and corresponding to the gate electrode 302, to the edge F1 away from the gate electrode and corresponding to the source electrode. Or the region 2011 in the first semiconductor layer 201 in FIG. 2 corresponding to between the cathode and the anode may include a region range in the first semiconductor layer 201, starting from the edge E1' close to the anode and corresponding to the cathode, to the edge F1' away from the anode and corresponding to the cathode. Correspondingly, here, the region 2013 in the first semiconductor layer 201 that corresponds to between the drain electrode and the gate electrode may be the region range, starting from the edge E2 close to the drain electrode 303 and corresponding to the gate electrode 302, to the edge F2 away from of the gate electrode and corresponding to the drain electrode. When the device is a HEMT, here, the length of the sub-region 2012' of the first semiconductor layer may be less than or equal to the size of the gate electrode, and preferably, the length may be ⅕ to ¼ of the length between the first electrode and the third electrode. When the device is a diode, the length of the sub-region 2012' of the first semiconductor layer may be greater than the size of the anode, and preferably, the length can be 1 to 10 microns.

It is not difficult to understand that the first semiconductor layer 201 has the region 2011/2013 wherein different dopant atoms co-exist, the width of which is adjustable. The doping concentration of N-type atoms such as silicon or germanium may be uniformly distributed or uneven. For example, it gradually decreases along the direction of the first electrode which is perpendicular to the substrate, that is, the direction which is perpendicular from the first surface 2011 to the second surface 2012. The doping depth of the N-type atoms such as silicon or germanium may be less than or equal to the thickness of the first semiconductor layer. The regions 2011 and 2013 in FIG. 1 may be discrete or continuous, and the regions 2011 in FIG. 2 may be continuous. Preferably, the doping depth of impurity atoms in the region 2011 may be smaller than the doping depth of the impurity atoms in the region 2013 to further meet the requirements for a more uniform electric field distribution between the gate electrode and drain electrode. The region 2011/2013 may be a regular region or an irregular region, or any combination of the above forms. The setting of the regions is also used to adapt to the requirement for the uniform electric field.

It should be pointed out that the P-type nitride layer does not deplete the two-dimensional charge carrier gas in the region 2011/2013, thereby maintaining better transport properties.

The sub-region 2012' in the first semiconductor layer 201 corresponds to the region of the gate electrode or the anode. The size of the sub-region 2012' can also be precisely controlled to further achieve the aforementioned length dimension. Due to the existence of the region 2012', the interface formed by the first or third semiconductor layer and the second semiconductor layer is made to have no 2DEG, when no bias is applied, due to the depletion of the first semiconductor layer, that is to say, in this region 2012', the electrical activity of P-GaN is still retained. Reducing the length of the part 2012' can effectively reduce the on-resistance of the device, and it is also beneficial to reducing the size of the device and improving the area utilization of a wafer. However, it needs to pointed out that if the length is too small, it will cause the device to have relatively larger leakage current when being under reverse bias. Exemplarily, when the semiconductor device is a HEMT/HHMT, the length of the region can be 2 to 4 microns; and when the semiconductor device is a diode, the region can be 6 to 8 microns.

As for the above device structure, it is also possible to grow an intrinsic or unintentionally doped GaN layer at the position of the first semiconductor layer, provide the first semiconductor layer (P-GaN) layer on the second semiconductor layer, and perform the corresponding processing as described above on the first semiconductor layer (P-GaN) layer.

However, it should be pointed out that the structure in which the first semiconductor layer (P-GaN) is arranged below the second semiconductor layer and then the corresponding region is subject to the doping processing, compared to the structure in which the first semiconductor (P-GaN) layer is arranged above the second semiconductor layer and then the corresponding region is subject to the doping processing, has more excellent performance, as shown in the performance test, since the distance between the gate electrode and the first/third semiconductor layer is relatively short. For example, it is more beneficial to obtaining a higher threshold voltage, and better control on the process for avoiding damage. Therefore, in this embodiment, it is preferable to arrange the first semiconductor layer (P-GaN) under the second semiconductor layer and then perform doping processing on the corresponding region.

It can be understood that although the above-mentioned device is described with the example that the first semiconductor layer is set as an P-GaN, those skilled in the art would know that when the device is an HHMT, the first semiconductor layer can be set as N-GaN, and the corresponding adaptive changes are made to the co-doping type in the sub-region 2011 and the sub-region 2013, so that the region 2011/2013 in the first semiconductor layer 201 where the dopant atoms co-exist, as a whole, is in form of P-type, weak N-type, high-resistance state or insulation state, and other parts can be set according to the aforementioned HEMT method.

A manufacturing method for manufacturing a semiconductor device of an embodiment of the present disclosure will now be exemplarily described with reference to FIGS. 3-11. It should be understood that although the HEMT and diode are taken as examples of the semiconductor device in this embodiment, it is only an exemplary description and is not a limitation on the type of the semiconductor device.

In step 100, a substrate 100 is provided. The relevant description in the embodiments of the present disclosure can be referred to for the selection of the material of the substrate 100, which will not be repeated here.

In step 200, the first semiconductor layer 201 is formed on the first surface of the substrate 100, wherein the first semiconductor layer 201 may include a P-type nitride semiconductor, such as P-GaN. Here, preferably, the first semiconductor layer 201 is formed by a material growth method. For example, the first semiconductor layer 201 can be formed by an epitaxial growth method, so that damage to the crystal structure caused by ion implantation method can be avoided. Here, the doping mode of the first semiconductor layer can be as described in the embodiments of the present disclosure, which will not be repeated here.

In step 300, a mask layer 206 is formed on the first semiconductor layer 201, and then only the mask corresponding to the position of the subsequent gate electrode region or anode region can be retained, and N-type impurities, such as Si, Ge, are implanted by ion implantation, or atoms, such as N, Ar, C, Fe and other atoms, are implanted by ion implantation. As a result, the regions 2011/2013 in the first semiconductor layer that are not protected by the mask, as a whole, are in form of N-type, or weak P-type, or in a form that they have resistance higher than that of the first semiconductor layer protected by the mask, or in the insulation state.

It is understandable that the corresponding mask and the parameters, such as injection dose and time, can also be designed according to specific requirements, so that the region 2011, as a whole, in the form of an N-type, a weak P-type, a high resistance value, or an insulation state, has the size, shape, depth, doping concentration, and etc., which are all adjustable and controllable.

Then, the mask can be removed, and the crystal lattice can be repaired by heat processing to reduce the damage caused by ion implantation.

In this embodiment, the region 2011/2013 that is not protected by the mask in the first semiconductor layer 201, as a whole, is in form of N-type, or weak P-type, or in the state that it has resistance higher than that of the region 2012 of the first semiconductor layer protected by mask, or in insulated state, which is achieved by ion implantation. In this manufacturing method, the processing manufacturing and control are simple, and it prevents the P-GaN from being very close to the drain electrode which causes the breakdown voltage of the device to drop sharply.

In step 400, the second semiconductor 202 is formed on the first semiconductor layer 201 which has been subject to the processing, thereby forming a two-dimensional charge carrier gas at the interface between the second semiconductor layer and the first semiconductor layer. It should be understood that a third semiconductor layer 203 may be firstly epitaxially grown on the first semiconductor layer 201 which has been subject to the processing, and then the second semiconductor layer 202 may be formed.

In step 500, a passivation layer 400 is formed on the second semiconductor layer 202.

In step 600, openings are formed at corresponding positions of the passivation layer 400 and the second semiconductor layer 202, and then the source electrode 301 and the drain electrode 303 are formed, respectively. And an opening is formed at the corresponding position of the passivation layer 400, and then a gate electrode 302 is formed on the second semiconductor layer 202. Alternatively, openings are formed at corresponding positions of the passivation layer 400 and the second semiconductor layer 202, and then a cathode 304 and an anode 305 are formed, respectively.

In step 700, optionally, a second insulating layer 401 is formed between the second semiconductor layer 202 and the gate electrode 402.

It can be understood that, before the step 200, a nucleation layer, a buffer layer, and the like may be formed on the substrate 100 first.

Another manufacturing method for manufacturing the semiconductor device of the embodiments of the present disclosure will now be exemplarily described with reference to FIGS. 12-15.

The difference between the manufacturing method and the foregoing manufacturing method is only that:

in step 300, a material layer 207 containing N-type impurities to be diffused is deposited in the first semiconductor layer 201, for example, a material layer containing silicon or a material layer containing germanium, or the material layer containing amorphous carbon or the iron-containing material layer, and the like. Then, the material layer 207 is lithographically etched to remove the material layer corresponding to the position where the gate electrode region or the anode region is subsequently formed, and then heated so that the impurity material diffuses into the first semiconductor layer 201, and then the material layer 207 is removed.

It is understandable that a lift-off process can also be used in step 300, wherein: a mask layer having openings is formed on the first semiconductor layer 201, and then a material layer 207 of N-type impurities to be diffused is formed on the mask layer, for example, a material layer containing silicon or a material layer containing germanium, or a material layer containing amorphous carbon or iron elements. By striping the mask layer, the material layer of the second-type dopant atoms only at the opening of the mask remains, and then the second-type dopant atoms diffuse from the material layer into the first semiconductor layer through the heat processing.

It is understandable that the corresponding mask, and parameters, such as dopant dose, time and the like, can also be designed according to specific requirements, so that the region, as a whole, in a form of N-type, weak P-type, high resistance or insulation state, has the size, shape, depth, doping concentration, and etc., which are all adjustable and controllable.

It is understandable that as for the above-mentioned method of introducing impurities by diffusion method, since the ion implantation is not used, its process realization and control are very simple, and its production cost is lower compared with the ion implantation, and there is no damage caused by the ion implantation, which is more beneficial to the improvement of device performance.

Figure 16:
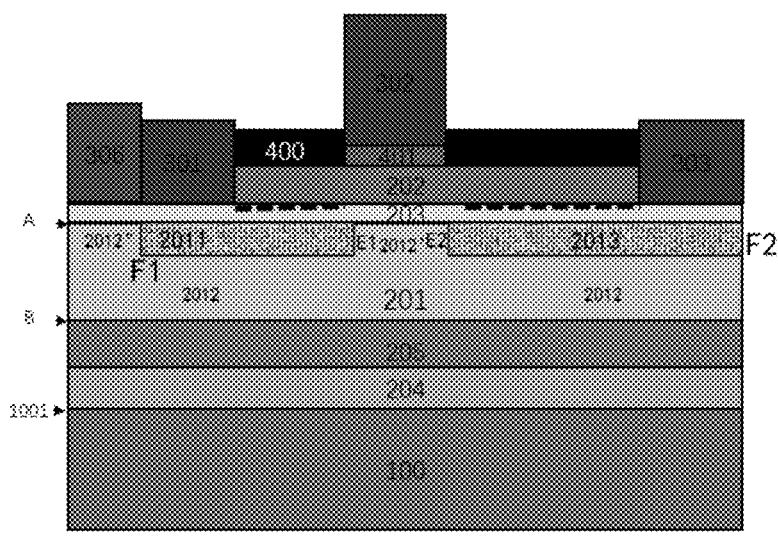
FIGS. 16-17 show schematic sectional views according to embodiments of the present disclosure.
Figure 17:
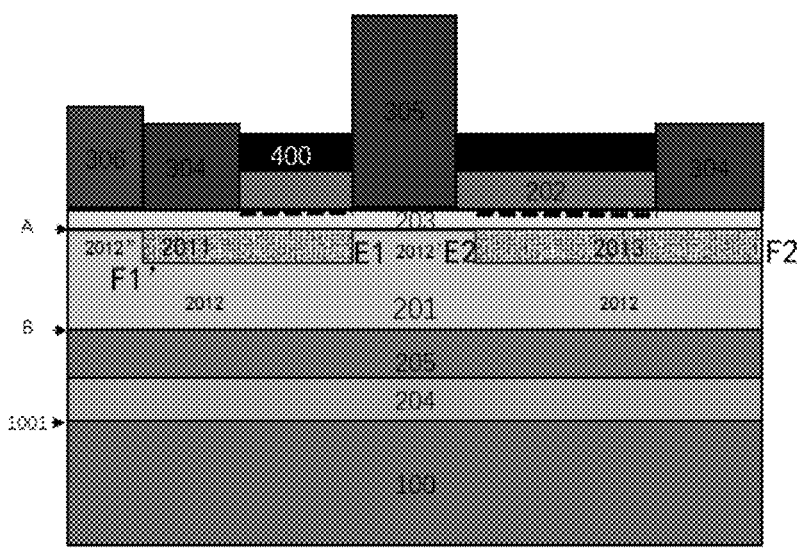
Figure 18:
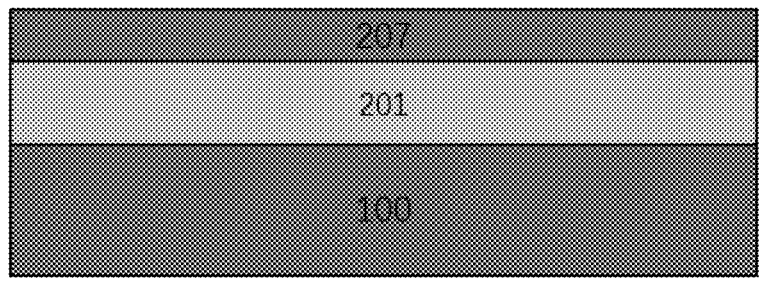
FIGS. 18-24 show schematic sectional views according to embodiments of the present disclosure.
Figure 19:
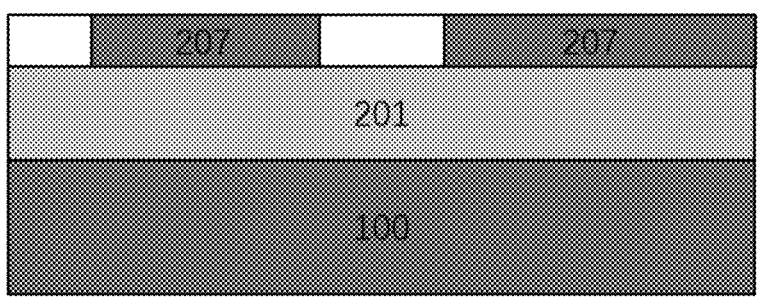
Figure 20:
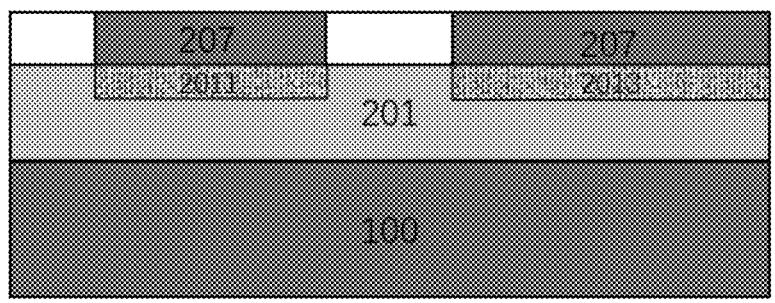
Figure 21:
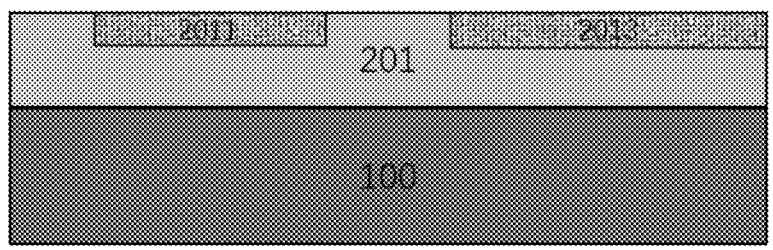
Figure 22:
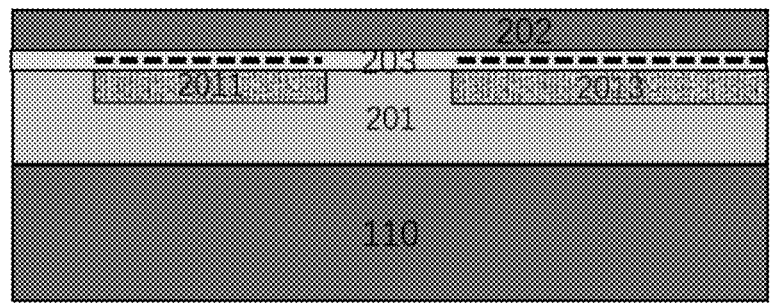
Figure 23:
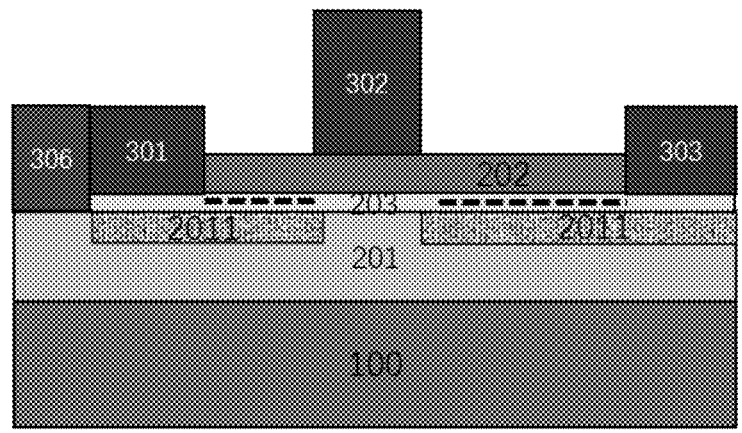
Figure 24:
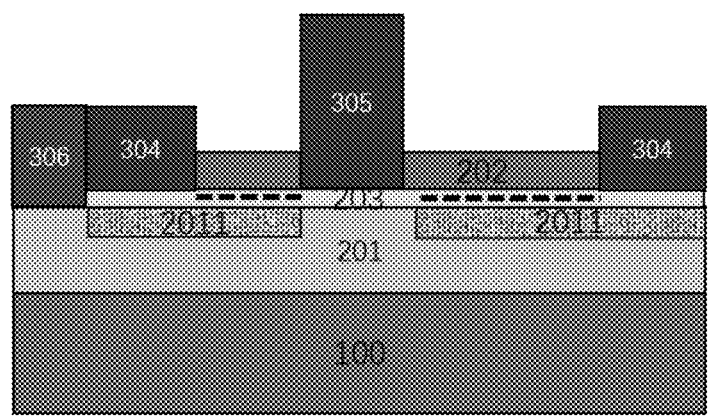
Figure 25:
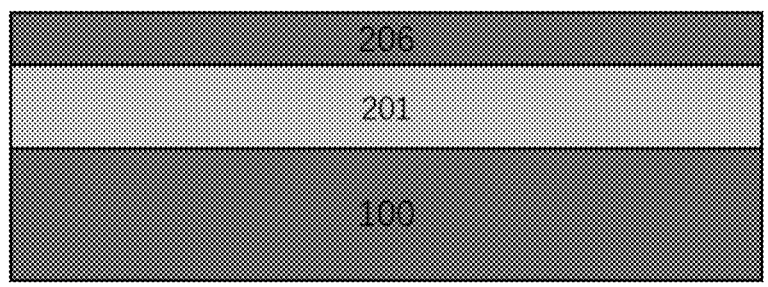
FIGS. 25-28 show schematic sectional views according to embodiments of the present disclosure.
Figure 26:
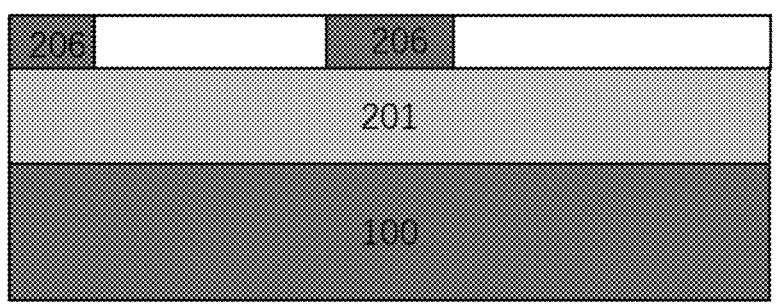
Figure 27:
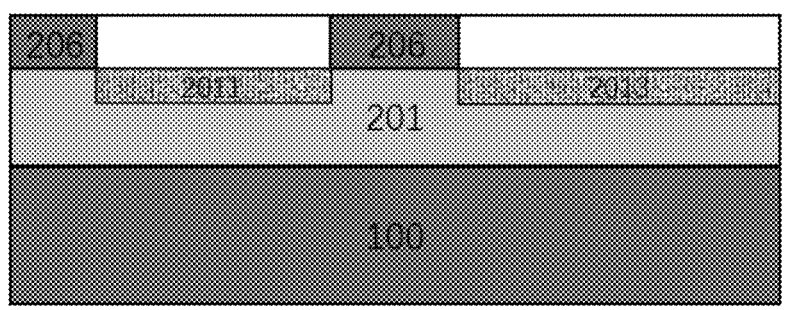
Figure 28:
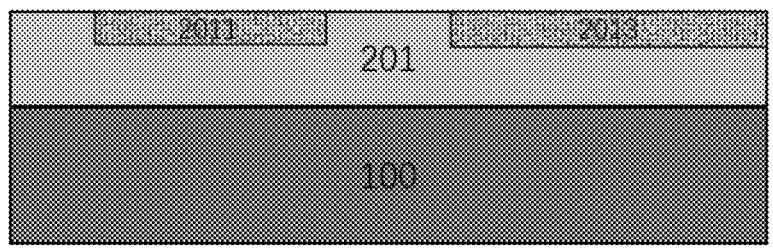

A semiconductor device according to the embodiments of the present disclosure will be described with reference to FIGS. 16-17.

The difference between this embodiment of the present disclosure and the previous embodiments is that there is a region in the first semiconductor layer 201 where no two different atoms co-exist, that is, the region 2012 in which the P-type impurity has the electrical activity retains. It not only includes the region corresponding to the gate electrode or the anode, but also includes the sub-region 2012", starting the edge F1 of the source electrode, or the edge F1 of the cathode, and being away from the gate electrode or the anode.

Then, a body electrode 306 in Ohmic contact with the first semiconductor layer is formed on the sub-region 2012". It should be noted that although the body electrode 306 is located on the sub-region 2012" in this embodiment, the body electrode may also be located at other positions as long as it is in an Ohmic contact with the first semiconductor layer.

The body electrode 306 may be physically connected to the source electrode, electrically connected, or not electrically connected to the source electrode.

A manufacturing method for manufacturing a semiconductor device of an embodiment of the present disclosure will now be exemplarily described with reference to FIGS. 18-24.

The difference between this manufacturing method and the manufacturing method in the foregoing embodiments lies in step 300 and step 600, and the remaining steps are the same as the manufacturing method in the foregoing embodiments.

In step 300, a material layer 207 containing impurities to be diffused may be deposited in the first semiconductor layer 201, for example, a material layer containing silicon, a material layer containing germanium, a material layer containing carbon or a material layer containing iron, and the like. Then, the material layer 207 can be lithographically etched to remove the material layer corresponding to the positions where the gate electrode region or the anode region will be subsequently formed, and to remove the material layer corresponding to the positions of the subsequent source electrode or the cathode, being away from the gate electrode or the anode, that is, the material layers in the sub-region 2012" and the sub-region 2012' are removed, and then the heating is performed to make the impurity material diffuse into the first semiconductor layer 201, and then the material layer 207 is removed.

It is understandable that in step 300, the step similar to the lift-off process described in the previous embodiments can also be used. By setting the mask opening, the material layer 207 is deposited, and by stripping the mask layer, the material layers in the region 2012" and the region 2012' are removed, and then the dopant atoms of the second type diffuse from the material layer to the sub-regions 2011/2013 in the first semiconductor layer through the heat processing.

It is understandable that the corresponding mask, and parameters such as dopant dose, time and the like, can also be designed according to specific requirements, so that the region, as the whole, in the form of N-type, weak P-type, high resistance or insulation state has the size, shape, depth, number, doping concentration, etc., which are also adjustable and controllable.

In step 600, openings may be formed in the corresponding positions of the passivation layer 400 and the second semiconductor layer 202, and then the source electrode 301, the drain electrode 303, and the body electrode 306 are formed, respectively. And an opening is formed at the corresponding position of the passivation layer 400, and then a gate electrode 302 is formed on the second semiconductor layer. Or openings are formed at the corresponding positions of the passivation layer 400 and the second semiconductor layer 202, and then a cathode 304, an anode 305, and the body electrode 306 are formed, respectively.

A method for manufacturing a semiconductor device according to an embodiment of the present disclosure will be described with reference to FIGS. 25-28.

The difference between this embodiment of the present disclosure and the foregoing embodiments lies in the step 300.

In step 300, a mask layer may be formed on the first semiconductor layer 201, and then the mask layer, corresponding to the positions where the gate electrode region or the anode region will be formed later, remains, and the mask layer 206, corresponding to the positions of the subsequent source electrode or the cathode electrode, being away from the gate electrode or the anode, may retain. That is, the region 2012″ and the region 2012′ are made to be covered by the mask layer. N-type impurities, such as Si and Ge, are introduced by ion implantation, or atoms, such as N, Ar, C, Fe, etc., are introduced by ion implantation, so that the first semiconductor layer that is not protected by the mask, as a whole, is in form of an N-type, or weak P-type, or in the state that it has the resistance higher than that of the first semiconductor layer protected by the mask, or in an insulating state.

It is understandable that the corresponding mask, and the parameters, such as injection dose, time and the like, can also be designed according to specific needs, so that the region, as a whole, in form of N-type, weak P-type, high resistance or insulation state, has the size, shape, depth, doping concentration, and etc., which are all adjustable and controllable.

The embodiments of the present disclosure also provide electronic equipment, which may be a voltage stabilizer, a rectifier, an inverter, a charger, and so on. The electronic equipment comprises any one of the semiconductor devices in the foregoing embodiments, and the semiconductor device constitutes a basic constituent unit in the electronic equipment.

The present disclosure has been described above in conjunction with specific embodiments, but it should be clear to those skilled in the art that these descriptions are all exemplary and do not limit the scope of protection of the present disclosure. Those skilled in the art can make various variations and modifications to the present disclosure according to the spirit and principle of the present disclosure, and these variations and modifications are also within the scope of the present disclosure.

INDUSTRIAL APPLICABILITY

The embodiments of the present disclosure provide semiconductor devices, manufacturing methods, and electronic equipment. Because the semiconductor devices of the embodiments of the present disclosure do not require the ion implantation, they can avoid the damage to the crystal structure, and can be easily achieved in processing. The device structure of the semiconductor device of embodiments of the present disclosure has better transport properties of the two-dimensional charge carrier gas, which is beneficial to the improvement of device performance.

What is claimed is:

1. A semiconductor device, comprising:
a substrate;
an interface, for generating two dimensional charge carrier gas;
a first electrode and a second electrode; and
a first semiconductor layer, containing dopant atoms of a first type formed on the substrate, wherein first regions and a second region are formed in the first semiconductor layer, wherein in the first regions, the dopant atoms of the first type do not have electrical activity, and in the second region, the dopant atoms of the first type have electrical activity; and
the second region comprises a portion coplanar with the first regions,
the semiconductor device further comprises a second semiconductor layer formed on the first semiconductor layer, wherein the two dimensional charge carrier gas is formed at an interface between the first semiconductor layer and the second semiconductor layer.

2. The semiconductor device according to claim 1, wherein the first regions are regions co-doped with the dopant atoms of the first type and dopant atoms of a second type, and the second region is a region doped with the dopant atoms of the first type, wherein in the first regions, two dimensional charge carrier gas at an interface corresponding to the first regions is not depleted, and in a sub-region of the second region, two dimensional charge carrier gas at an interface corresponding to the sub-region is substantially depleted.

3. The semiconductor device according to claim 1, wherein when the semiconductor device is a HEMT or a diode, the first regions as a whole are of N-type, weak P-type, high-resistance type, or insulating type; and when the semiconductor device is an HHMT, the first regions as a whole are of P-type, weak N-type, high-resistance type, or insulating type.

4. The semiconductor device according to claim 1, wherein when the semiconductor device is a HEMT/HHMT, a range of the substrate where a sub-region in the second region is projected is less than or equal to a range of the substrate where the second electrode is projected; and when the semiconductor device is a diode, the range of the substrate where a sub-region in the second region is projected is larger than the range of the substrate where the second electrode is projected.

5. The semiconductor device according to claim 2, wherein the dopant atoms of the second type are atoms of an N-type or being capable of generating a deep level effect, and the dopant atoms of the first type are P-type atoms; or the dopant atoms of the second type are atoms of P-type or being capable of generating a deep level effect, and the dopant atoms of the first type are of N-type.

6. The semiconductor device according to claim 1, further comprising a third semiconductor layer formed on the first semiconductor layer, wherein the two dimensional charge carrier gas is formed at an interface between the third semiconductor layer and the second semiconductor layer.

7. The semiconductor device according to claim 1, further comprising a body electrode, wherein the body electrode is electrically connected to or disconnected from the first electrode.

8. The semiconductor device according to claim 1, further comprising a body electrode, wherein the body electrode is in an Ohmic contact with the first semiconductor layer.

9. The semiconductor device according to claim 1, wherein when the first regions are discrete, thicknesses of the first regions are equal or unequal to each other.

10. A manufacturing method of a semiconductor device, comprising:
providing a substrate;
forming an interface that generates two dimensional charge carrier gas; and
forming at least a first electrode and a second electrode;
forming, on the substrate, a first semiconductor layer containing dopant atoms of a first type, wherein dopant atoms of a second type are doped at a first region in the first semiconductor layer so that the dopant atoms of the first type in the first region do not have electrical activity, and a second region in the first semiconductor layer, which is not doped with the dopant atoms of the second type, has the dopant atoms of the first type having electrical activity; and
forming a second semiconductor layer on the first semiconductor layer, so that the two dimensional charge carrier gas is formed at an interface between the first semiconductor layer and the second semiconductor layer.

11. The manufacturing method according to claim 10, wherein the dopant atoms of the second type are atoms of N-type or being capable of generating deep level effect, and the dopant atoms of the first type are P-type atoms; or
the dopant atoms of the second type are atoms of P-type or being capable of generating a deep level effect, and the dopant atoms of the first type are of N-type.

12. The manufacturing method according to claim 10, further comprising forming a third semiconductor layer on the first semiconductor layer, so that the two dimensional charge carrier gas is formed at an interface between the third semiconductor layer and the second semiconductor layer.

13. The manufacturing method according to claim 10, further comprising forming a third electrode, wherein the first electrode and the third electrode are in Ohmic contact with the two dimensional charge carrier gas, and the second electrode is in a Schottky contact with the second semiconductor layer or the first semiconductor layer.

14. The manufacturing method according to claim 10, further comprising forming an insulating layer between the second electrode and the second semiconductor layer.

15. The manufacturing method according to claim 10, further comprising forming a passivation layer on the second semiconductor layer; or a nucleation layer, a buffer layer and/or an insertion layer are formed on the substrate.

16. The manufacturing method according to claim 10, further comprising forming a fourth electrode, wherein the fourth electrode is in Ohmic contact with the first semiconductor layer.

17. The manufacturing method according to claim 16, wherein the fourth electrode is electrically connected or not connected to the first electrode.

18. Electronic equipment, comprising the semiconductor device according to claim 1.

* * * * *